(12) United States Patent
Zyuban et al.

(10) Patent No.: US 9,660,620 B1
(45) Date of Patent: May 23, 2017

(54) DUAL-EDGE TRIGGER CLOCK GATER

(71) Applicant: Apple Inc., Cupertino, CA (US)

(72) Inventors: Victor Zyuban, Sunnyvale, CA (US); Nimish Kabe, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/217,669

(22) Filed: Jul. 22, 2016

(51) Int. Cl.
| | |
|---|---|
| *H03K 5/01* | (2006.01) |
| *G05B 19/41* | (2006.01) |
| *H03K 19/21* | (2006.01) |
| *H03K 5/00* | (2006.01) |

(52) U.S. Cl.
CPC ............... *H03K 5/01* (2013.01); *G05B 19/41* (2013.01); *H03K 19/21* (2013.01); *H03K 2005/00019* (2013.01); *H03K 2005/00234* (2013.01)

(58) Field of Classification Search
CPC .................................. H03K 5/01; H03K 19/21
See application file for complete search history.

(56) References Cited

U.S. PATENT DOCUMENTS

| | | | |
|---|---|---|---|
| 6,362,680 B1* | 3/2002 | Barnes ................... | H03M 9/00 327/199 |
| 6,496,050 B2* | 12/2002 | Lloyd .................. | H03K 5/1252 327/212 |
| 6,938,225 B2 | 8/2005 | Kundu | |
| 9,018,995 B2 | 4/2015 | Subramani et al. | |

FOREIGN PATENT DOCUMENTS

| | | |
|---|---|---|
| WO | 2009136875 | 11/2009 |

* cited by examiner

*Primary Examiner* — Jeffrey Zweizig
(74) *Attorney, Agent, or Firm* — Meyertons, Hood, Kivlin, Kowert & Goetzel, P.C.; Michael B. Davis

(57) ABSTRACT

Techniques are disclosed relating to dual-edge triggered clock gater circuitry. In some embodiments, an apparatus includes dual-edge triggered clock gater circuitry configured to generate an output signal based on an input clock signal and a control signal that indicates whether to gate the input clock signal. In some embodiments, the clock gater circuitry includes first and second storage elements. In some embodiments, the clock gater circuitry includes multiplexer circuitry that selects between outputs of the first and second storage elements to generate the output signal. In some embodiments, the clock gater circuitry includes a third storage element configured to store an indication of which of the first and second storage elements stores a first digital value and which stores an inverse of the first digital value when not gating. In some embodiments, the clock gater circuitry includes a buffering element configured, when gating, to copy data stored in one of the first and second storage elements to the other of the first and second storage elements.

20 Claims, 14 Drawing Sheets

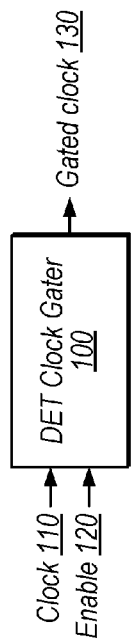
Fig. 1
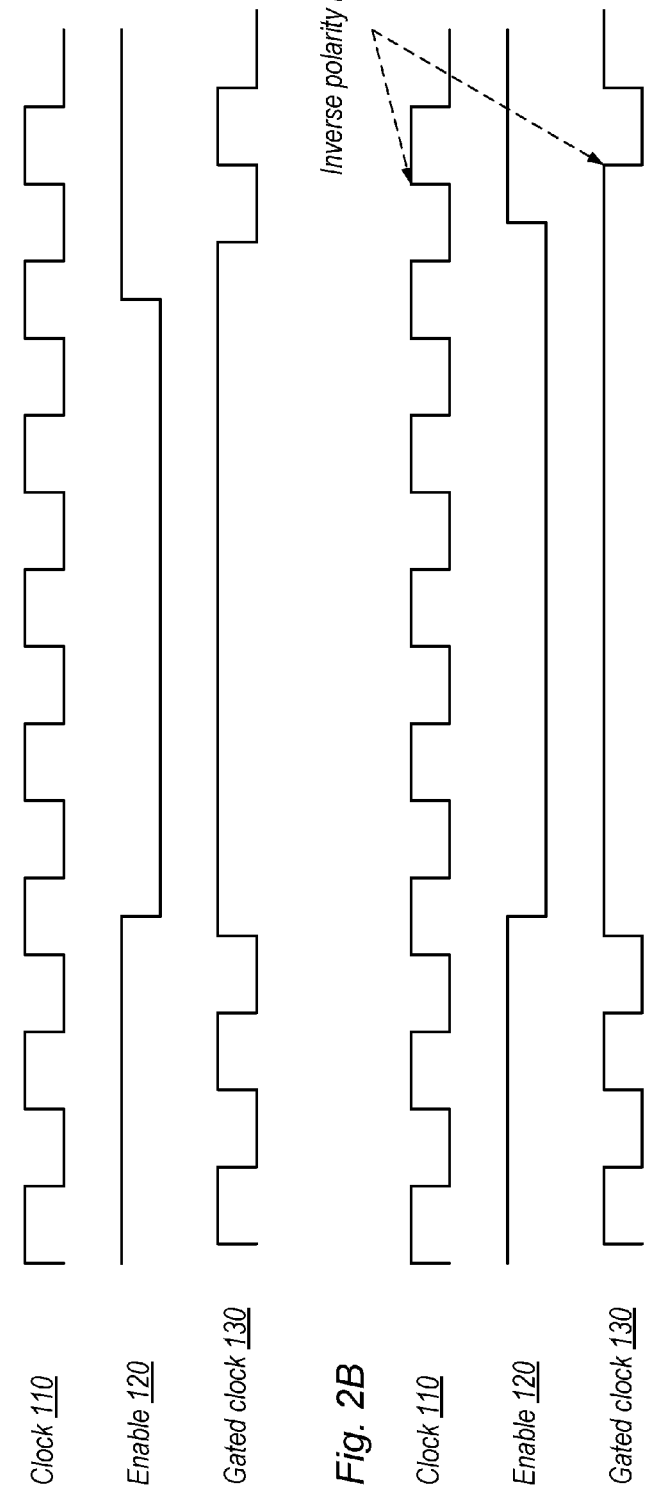
Fig. 2A
Fig. 2B

DUAL-EDGE TRIGGER CLOCK GATER

The present application is related to U.S. patent application Ser. No. 15/217,122, filed Jul. 22, 2016 and titled "Balancing Delay Associated with Dual-Edge Trigger Clock Gaters."

BACKGROUND

Technical Field

This disclosure relates generally to clocking circuitry and more particularly to clock gating for dual-edge triggered circuits.

Description of the Related Art

Dual-edge triggered (DET) circuits are configured to perform activities on both rising and falling edges of a clock signal. For example, a DET flip-flop may be configured to accept and store an input value both when the clock rises and when it falls. DET circuitry may achieve a given performance threshold with half the clock frequency.

Clock gater circuits are configured to block clock signals to other circuitry (e.g., to reduce power consumption when other circuitry is not being used). Clock gaters are typically distributed throughout the clock tree of an integrated circuit in order to allow gating of the clock at different granularities to portions of the circuit. For DET circuitry, clock gaters may need to be able to begin gating the clock signal on either the rising or the falling edge, depending on when a gating signal is asserted. Therefore, a DET clock gater may operate in one of two states of modes, 1) where the output of the gater is inverted with respect to the input and 2) wherein the output of the gater is not inverted with respect to the input. Low power consumption is typically a desirable feature of clock gating circuitry. Further, DET clock gaters may have different delay in different operational modes, which may result in unbalanced clock signals to different circuit portions.

SUMMARY

Techniques are disclosed relating to dual-edge triggered clock gater circuitry. In some embodiments, an apparatus includes dual-edge triggered clock gater circuitry configured to generate an output signal based on an input clock signal and a control signal that indicates whether to gate the input clock signal. In some embodiments, the clock gater circuitry includes first and second storage elements, where the first storage element is controlled by the input clock signal and the second storage element is controlled by an inversion of the input clock signal. In some embodiments, the storage elements are latches. In some embodiments, based on a first state of the control signal, one of the first and second storage elements is configured to store a first digital value and the other of the first and second storage elements is configured to store a second digital value that is the inverse of the first digital value. For example, the first storage element may store a logical "1" while the other storage element stores a logical "0" when the clock gater is not gating the clock signal, or vice versa. In some embodiments, the clock gater circuitry includes multiplexer circuitry that is controlled by the input clock signal and is configured to select between outputs of the first and second storage elements to generate the output signal.

In some embodiments, the clock gater circuitry includes a third storage element configured to store an indication of which of the first and second storage elements stores the first digital value, and provide the first digital value and the inverse of the first digital value to the first and second storage elements based on the first state of the control signal (corresponding to not gating the clock). In some embodiments, the clock gater circuitry includes a buffering element configured, in response to a second state of the control signal (corresponding to gating the clock), to copy data stored in one of the first and second storage elements to the other of the first and second storage elements. This may result in a constant digital value being output from the clock gater circuitry when gating the clock. In various embodiments, the disclosed clock gater circuitry may have low switching power consumption.

BRIEF DESCRIPTION OF THE DRAWINGS

FIG. 1 is a block diagram illustrating an exemplary DET clock gater, according to some embodiments.

FIGS. 2A-2B are timing diagrams illustrating exemplary DET clock gating in inverting and non-inverting modes.

Figure 3A:
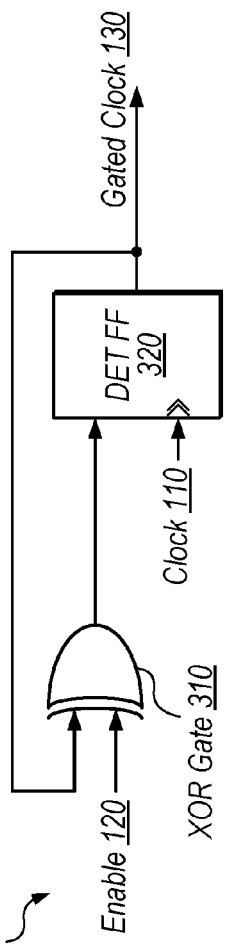
FIG. 3A-3B are block diagram illustrating exemplary implementations of DET clock gaters with feedback signals.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims that a structure is "configured to" perform one or more tasks is expressly intended not to invoke 35 U.S.C. §112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

DETAILED DESCRIPTION

Figure 6:
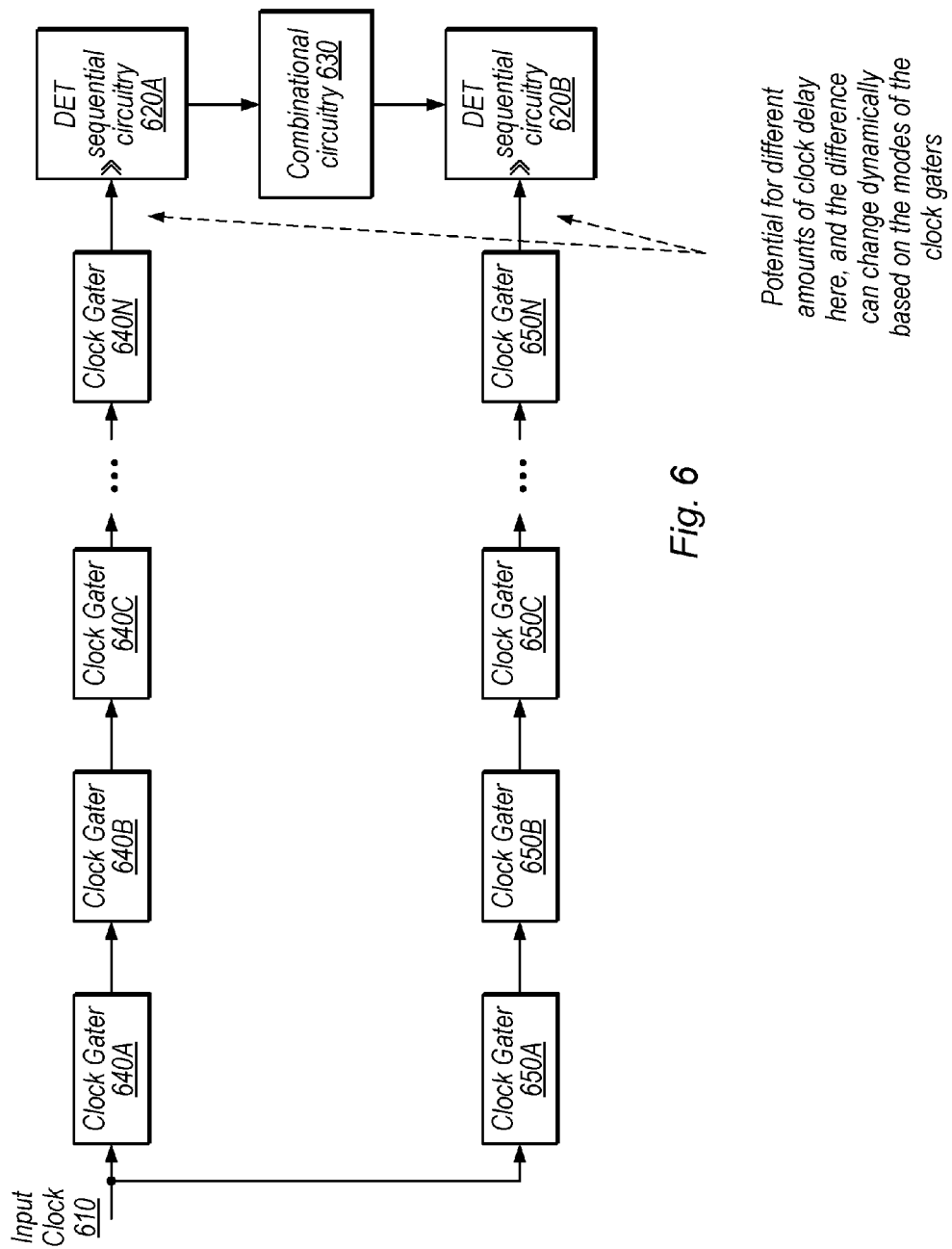
FIG. 6 is a block diagram illustrating clock gaters hierarchically arranged in a clock tree, according to some embodiments.
Figure 7:
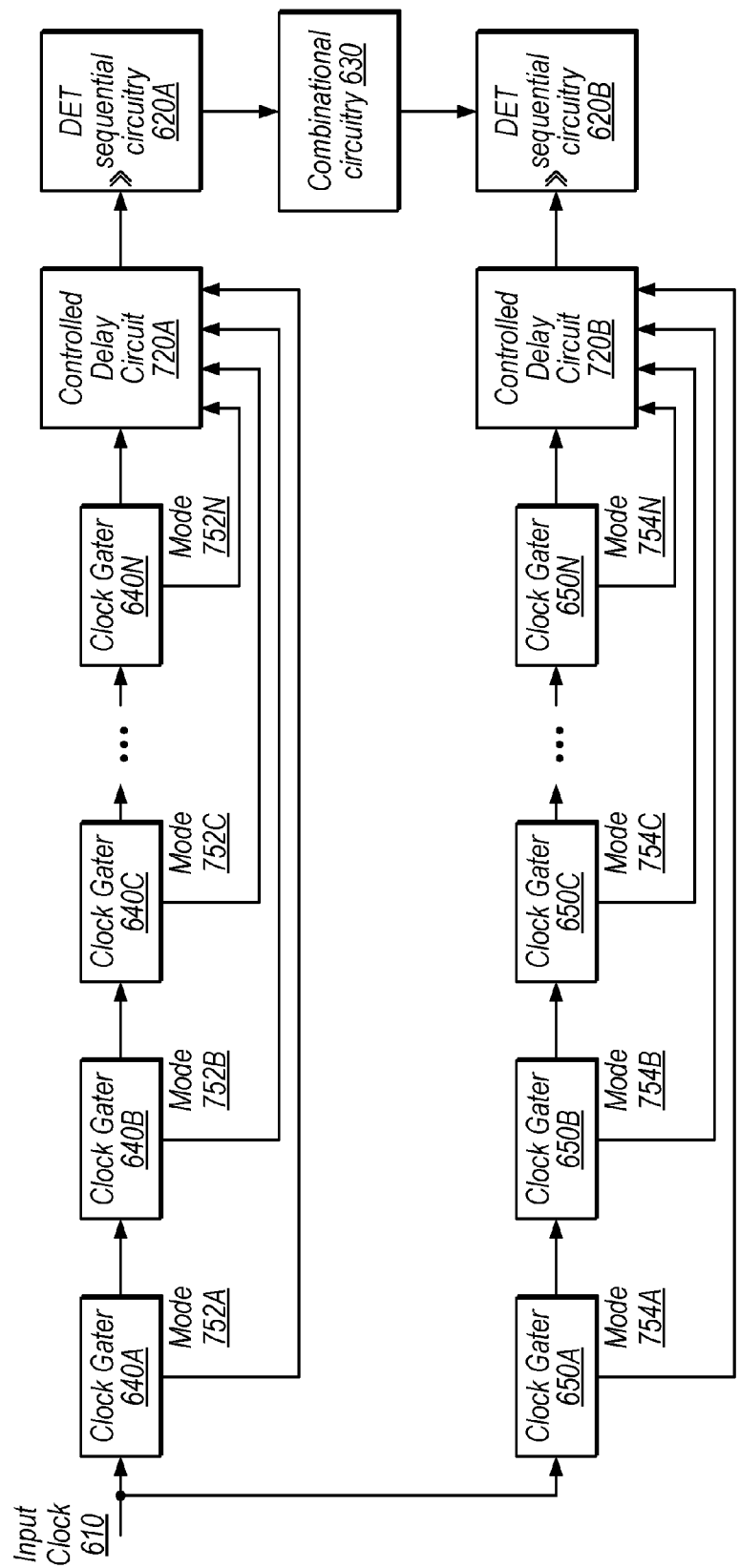
FIG. 7 is a block diagram illustrating exemplary controlled delay circuits coupled to the output of series of DET clock gaters, according to some embodiments.
Figure 8:
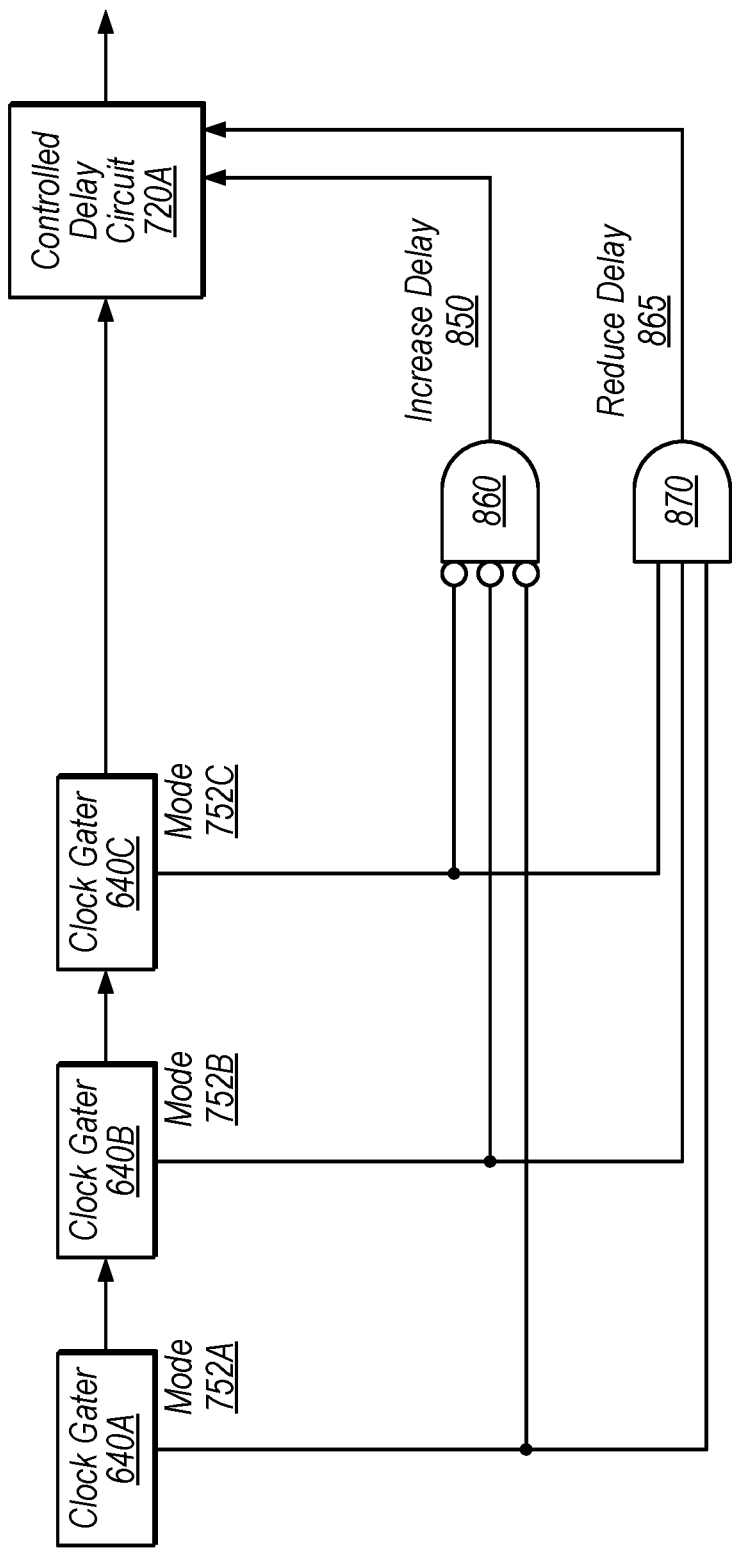
FIG. 8 is a block diagram illustrating exemplary control circuitry for a controlled delay circuit, according to some embodiments.
Figure 11:
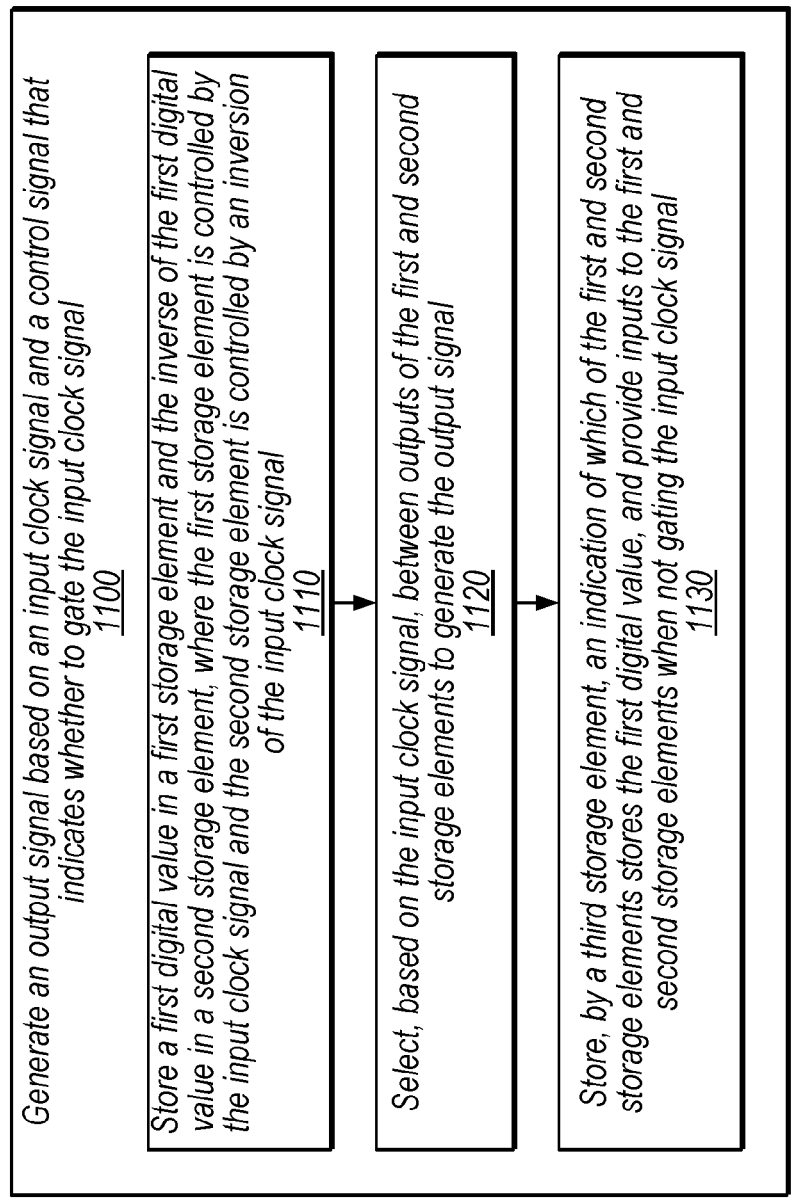
FIG. 11 is a flow diagram illustrating a method for operating a dual-edge triggered clock gater, according to some embodiments.
Figure 12:
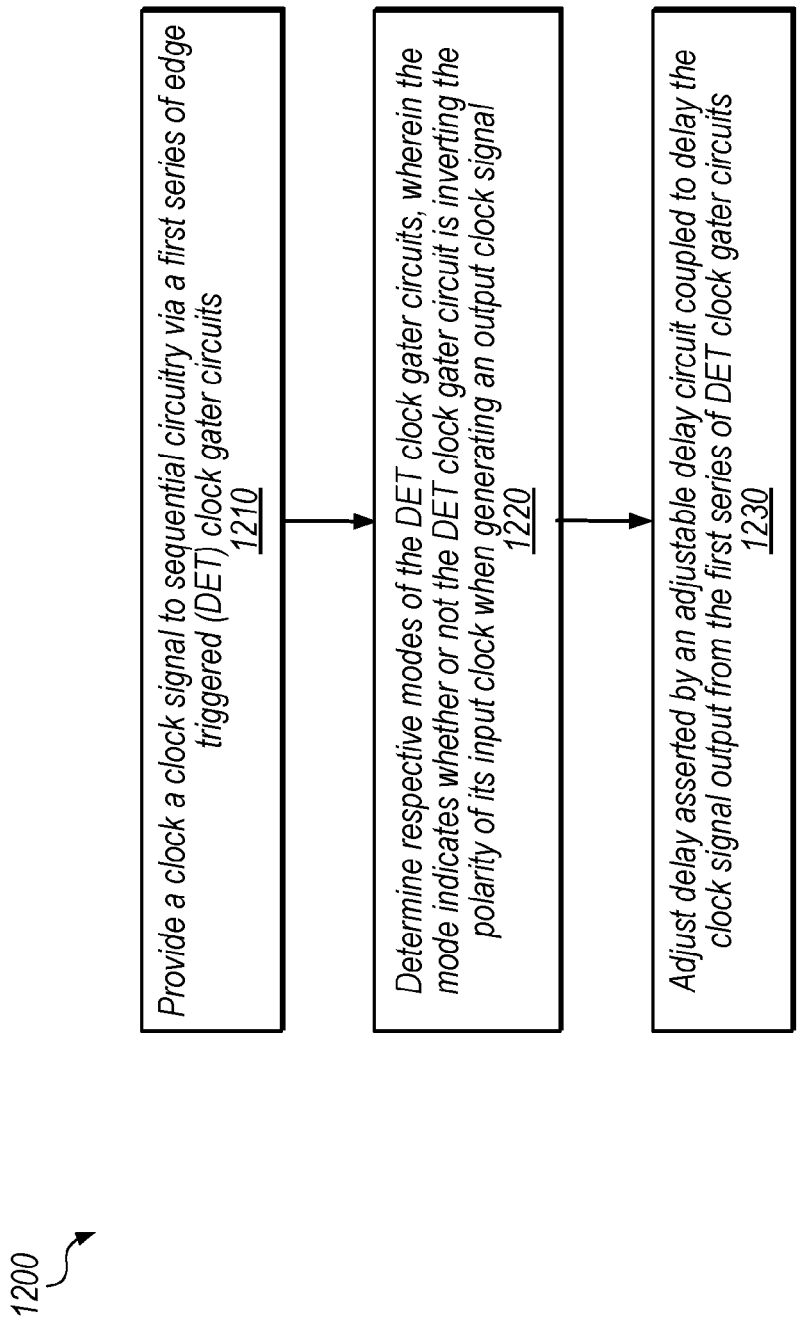
FIG. 12 is a flow diagram illustrating a method for controlling delay associated with a series of DET clock gaters, according to some embodiments.
Figure 13:
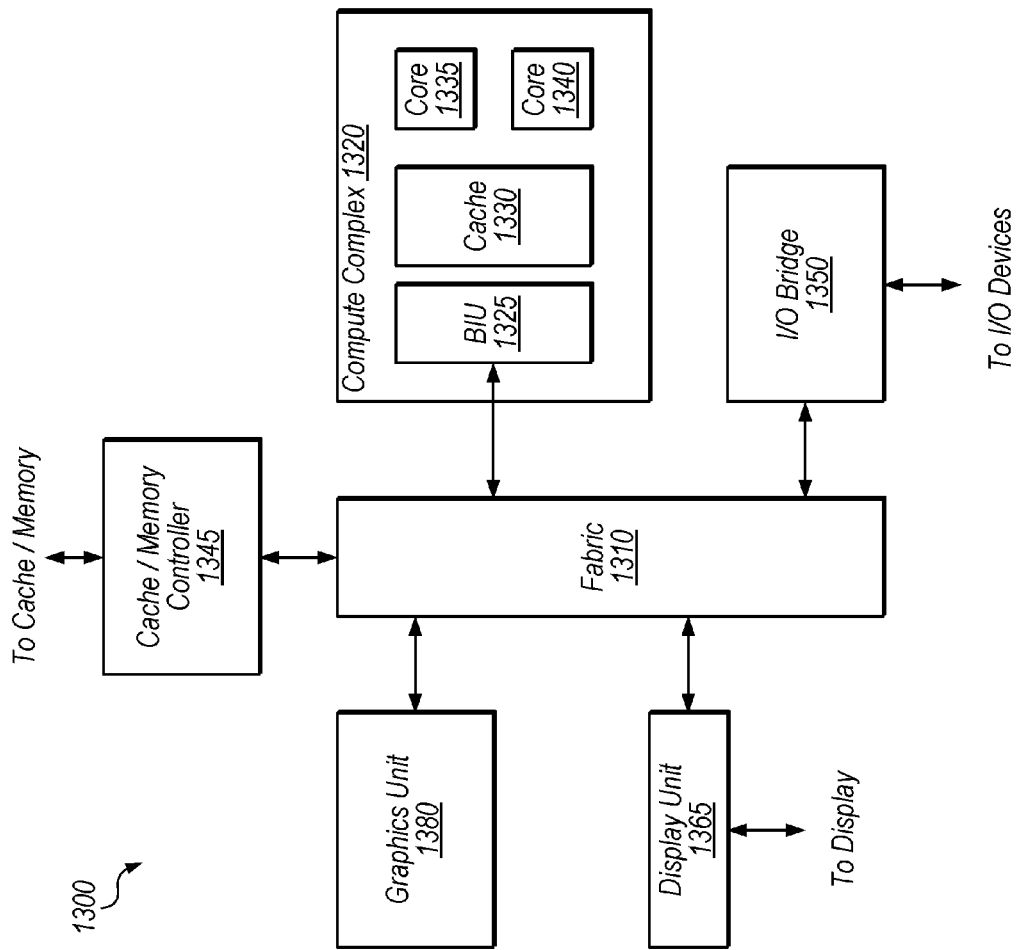
FIG. 13 is a block diagram illustrating an exemplary device, according to some embodiments.
Figure 14:
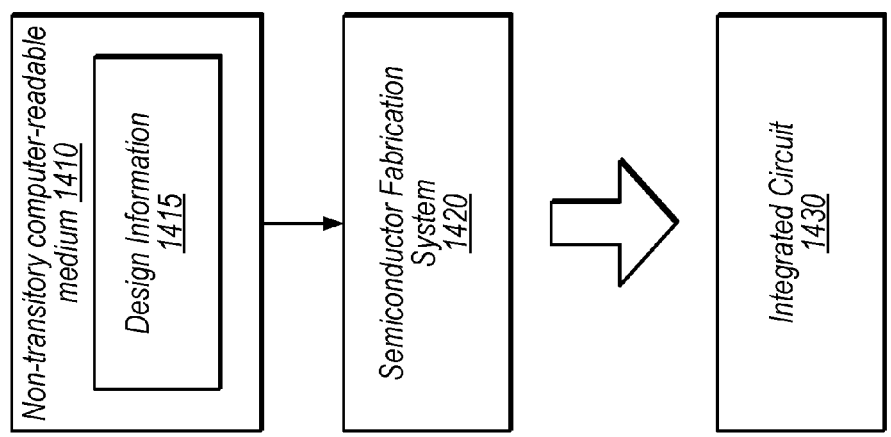
FIG. 14 is a block diagram illustrating an exemplary computer-readable medium, according to some embodiments.

This disclosure initially describes, with reference to FIGS. 1-2B, an overview of dual-edge triggered (DET) clock gater functionality. FIGS. 3A-6 and 10 show exemplary DET clock gater embodiments. FIGS. 7-9 show exemplary circuitry for balancing clock delay in circuit designs with DET clock gaters arranged in series. FIGS. 11-12 show exemplary methods, FIG. 13 shows an exemplary device, and FIG. 14 shows an exemplary computer-readable medium. In various embodiments, the disclosed techniques may reduce switching power consumption and/or balance clock delay (which may in turn improve performance, reduce area, and/or reduce power consumption).

Overview of Clock Gater for Dual-Edge Triggered Circuitry

FIG. 1 is a block diagram illustrating an exemplary DET clock gater 100 that is configured to generate an output signal (gated clock 130) based on an input clock signal 110 and an enable signal 120. FIGS. 2A and 2B are clock waveforms that illustrate exemplary functionality of clock gater 100.

In the illustrated embodiment of FIG. 2A, clock gater 100 is configured to force gated clock signal 130 to remain high after de-assertion of enable 120 and then allow gated clock signal 130 to resume following the input clock 110 after re-assertion of enable 120. In various embodiments, clock gater 100 is configured to freeze gated clock 130 at its current position subsequent to de-assertion of enable 120. This may include gating the clock before the next edge of the input clock, regardless of whether the next edge is a rising or falling edge.

Note that the terms assertion and de-assertion are not intended to limit the scope of the disclosure regarding control signaling for clock gaters. As well understood by those in the art, any of various appropriate values may be used to indicate assertion or de-assertion of a given signal. Further, other types of control signals may be used in some embodiments. For example, a gate signal may be used to control clock gater circuitry and may correspond to the inverse of the enable signal. Generally, such signaling may be referred to as a "control signal" that indicates whether to clock gate an input clock signal.

FIG. 2B shows that clock gater 100 may invert the polarity of gated clock 130 relative to input clock 110 when gating the clock for an odd number of clock edges. This change in polarity may ensure that clock edges occur at the appropriate time. The fact that the polarity is different typically does not affect digital functionality, e.g., because DET circuitry does not discriminate between rising and falling clock edges.

Figure 3B:
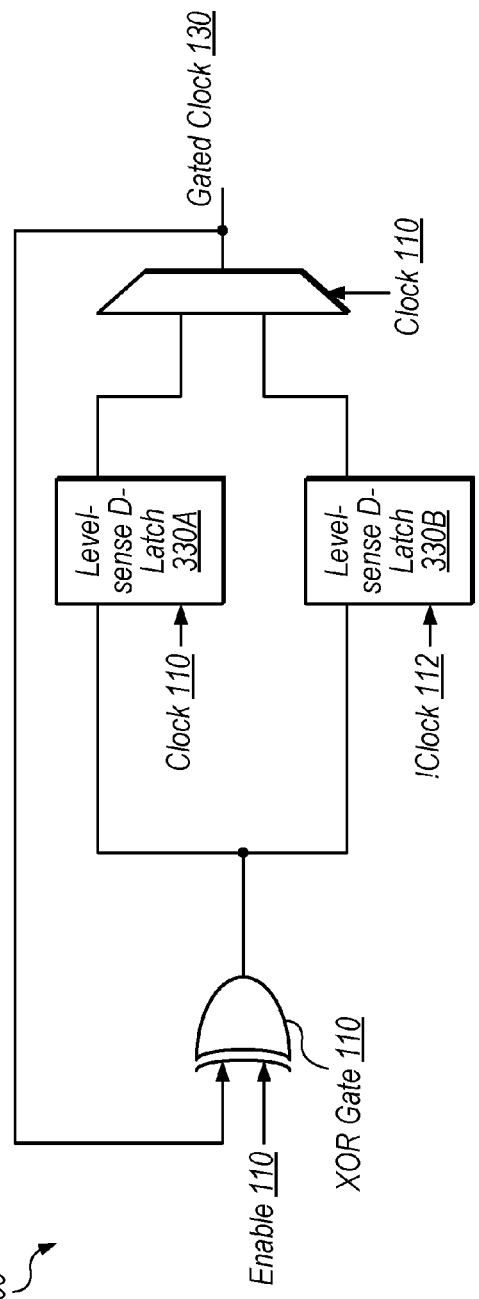

FIGS. 3A and 3B are block diagrams illustrating exemplary implementations of clock gater 100. In the illustrated example, FIG. 3B is a more detailed implementation of FIG. 3A. In the illustrated embodiment of FIG. 3A, clock gater 100 includes an exclusive-or (XOR) gate 310 and dual-edge triggered flip-flop (FF) 320. XOR gate 310, in the illustrated embodiment is configured to perform an XOR operation on the enable signal and a feedback signal from the output of clock gater 100. DET FF 320, in the illustrated embodiment, is configured to store the input signal received from XOR gate 310 at both rising and falling edges of clock 110.

FIG. 3B shows an example implementation of clock gater 100 in which DET FF 320 is implemented using two level-sense D-latches 330A-330B and a clock-controlled multiplexer. In the illustrated embodiment, latch 330A receives clock signal 110 while latch 330B receives the inverse of clock signal 110 (represented as !clock 112; generally the "!" symbol is used to represent inversion herein). Therefore, in the illustrated embodiment on a given clock edge, one of the latches will be latching new input data while the other latch will be driving gated clock 130. In some embodiments, this configuration achieves the functionality of FIGS. 2A-2B discussed above.

The feedback configuration of FIGS. 3A and 3B may consume considerable amounts of power when driving gated clock 130 to each new value via the feedback loop (e.g., at each clock edge because the input to the XOR gate changes value on every edge of the clock). Therefore, various embodiments discussed in further detail below utilize other techniques for DET clock gating instead of feedback.

Exemplary DET Clock Gater with Storage Element and Buffering Circuitry

Figure 4:
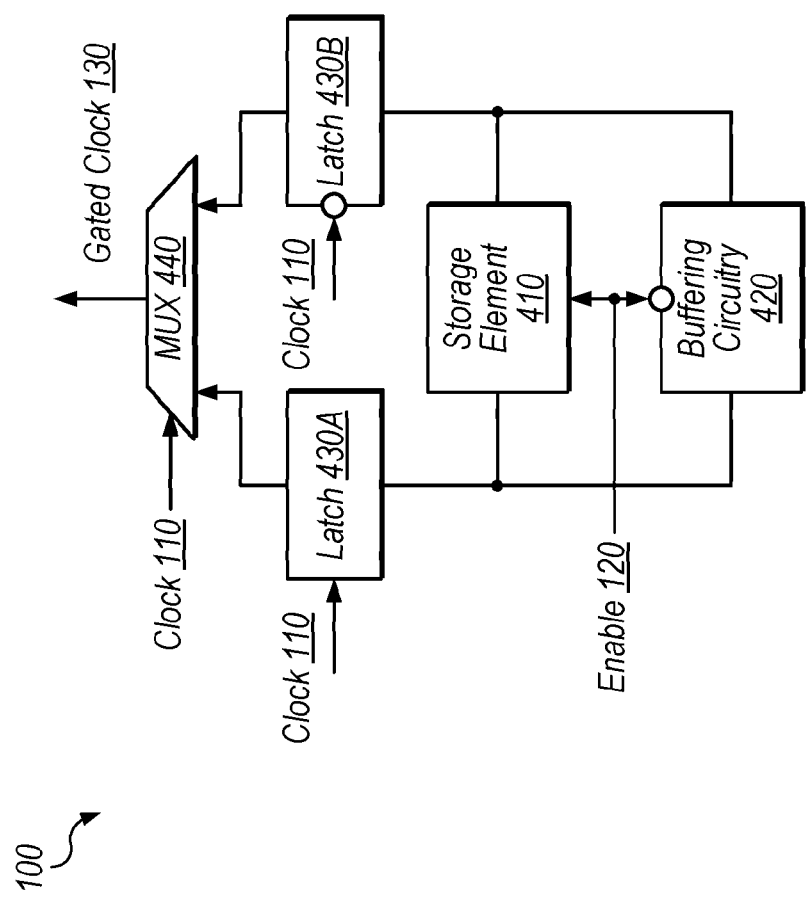
FIG. 4 is a block diagram illustrating an exemplary DET clock gater with a storage element, according to some embodiments.

FIG. 4 is another block diagram illustrating clock gater 100, according to some embodiments. In the illustrated embodiment, clock gater 100 includes storage element 410, buffer circuitry 420, latches 430A and 430B, and multiplexer (MUX) 440. In the illustrated embodiment, gated clock 130 is not generated based on a feedback signal from the output of MUX 440. Instead, in the illustrated embodiment, storage element 410 is configured to store information that indicates the state of clock gater 100 when enable 120 was de-asserted, which allows clock gater 100 to operate correctly when enable 120 is re-asserted.

MUX 440, in the illustrated embodiment, is configured to select between the outputs of latches 430 to generate gated clock signal 130. For example, in some embodiments MUX 440 is configured to select the output of latch 430A when the clock signal 110 is low and to select the output of latch 430B when the clock signal 110 is high.

When the clock is enabled, in the illustrated embodiment, the latches 430A and 430B store different digital values that do not change until the clock is gated. For example, latch 430A may be configured to store a digital "0" and latch 430B configured to store a digital "1" during an interval in which the clock is enabled or latch 430A may be configured to store a "1" and latch 430B configured to store a "0" during an interval in which the clock is enabled.

Storage element 410, in the illustrated embodiment, is configured to store an indication (e.g., one bit) of which latch stores which value. This indication may correspond to whether or not clock gater 100 is inverting polarity of the input clock. Storage element 410, in the illustrated embodiment, is also configured to provide the appropriate values to the inputs of latches 430A and 430B based on this information, during assertion of enable 120. In the illustrated embodiment, the inputs to latches 430A and 430B are the inverse of each other when enable 120 is asserted. In some embodiments, clock gater 100 tri-states the outputs of storage element 410 when enable 120 is de-asserted.

When the clock is gated, in the illustrated embodiment, the latches 430A and 430B store the same digital value, so that gated clock 130 is fixed either high or low and does not oscillate.

Buffering circuitry 420, in the illustrated embodiment, is configured to drive both latches 430 to store the same value during de-assertion of enable 120. In the illustrated embodiment, latches 430 are bi-directional latches that, when not accepting new input data, are configured to drive their stored value on both the input and output lines. Therefore, in this embodiment, buffering circuitry 420 is configured to connect the inputs of the two latches such that the latch that is receiving a new value will receive and store the output value from the other latch, resulting in the same value being stored in the two latches 430 during intervals in which enable 120 is de-asserted. In other embodiments that do not use bi-directional latches, the buffering circuitry may be configured to couple the output of each latch to the input of the other latch to perform similar functionality (this configuration is not explicitly shown). In some embodiments, buffering circuitry 420 behaves as an open circuit when enable is asserted.

In various embodiments the configuration of FIG. 4 provides the functionality discussed above with reference to FIGS. 2A-2B. Further, the embodiment of FIG. 4 may substantially reduce switching power consumption in clock gater circuitry relative to the embodiments of FIG. 3B, for example. The reduction in power consumption may be realized because storage element 410 is configured to quickly provide inputs to latches 430 rather than needing to drive the inputs to the latches based on a feedback signal as in FIG. 3B, for example.

Figure 5B:
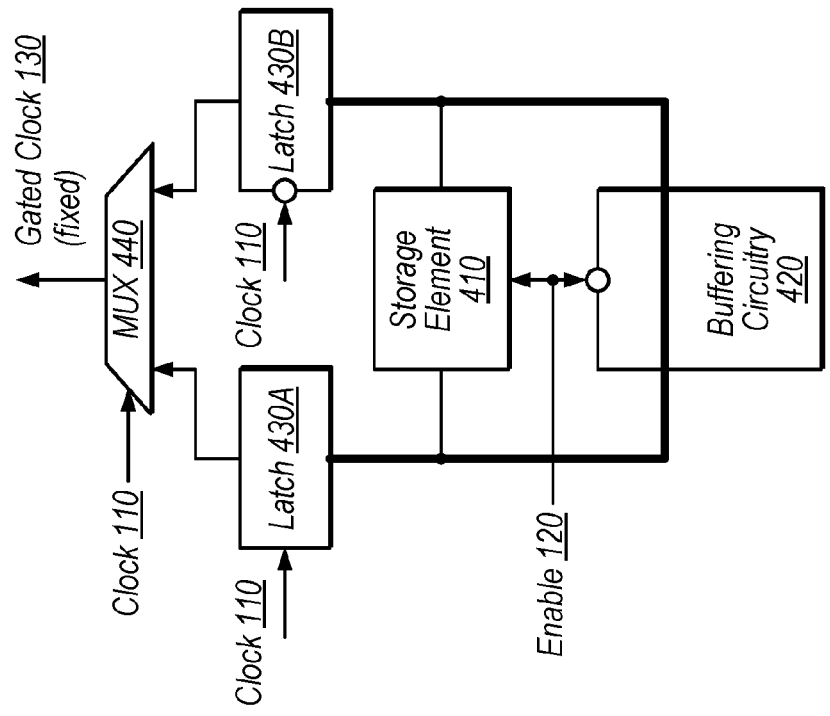
FIGS. 5A-5B are block diagrams illustrating different modes of a DET clock gater, according to some embodiments.
Figure 5A:
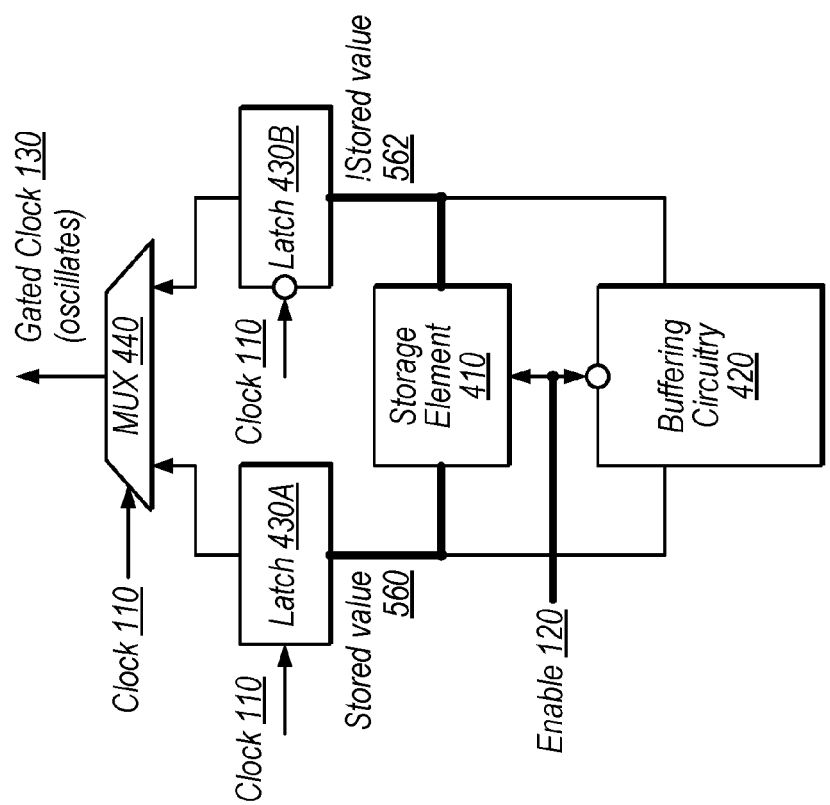

FIGS. 5A-5B illustrate exemplary operation of the clock gater 100 of FIG. 4 when enable is asserted (in FIG. 5A) or de-asserted (in FIG. 5B). In FIG. 5A, buffering circuitry 420 does not connect the inputs of the latches (e.g., is tri-stated in some embodiments). In this scenario, storage element 410 provides its stored value 560 to latch 430A and the inverse of the stored value (!stored value) 562 to latch 430B. In this state, the latches 430 hold different values, which are propagated to gated clock 130 at the same frequency as clock 110 (although the polarity of clock 110 and gated clock 130 may be different, as discussed above with reference to FIG. 2B).

In FIG. 5B, when enable is de-asserted, buffering circuitry 420 is configured to copy the value of one of the latches to the other (to the latch that is currently accepting a new value). This drives the two latches to the same value, effectively gating the clock. Storage element 410, in the illustrated embodiment, is not configured to drive the inputs to the latches in this scenario. When enable 120 is later re-asserted, storage element 410 may resume driving the inputs to the latches 430 to ensure that the first clock edge of gated clock 130 corresponds in time to the appropriate edge of clock 110. Note that the value stored in storage element 410, in some embodiments, indicates which latch copies its value to the other latch just after re-assertion of enable 120.

Figure 10:
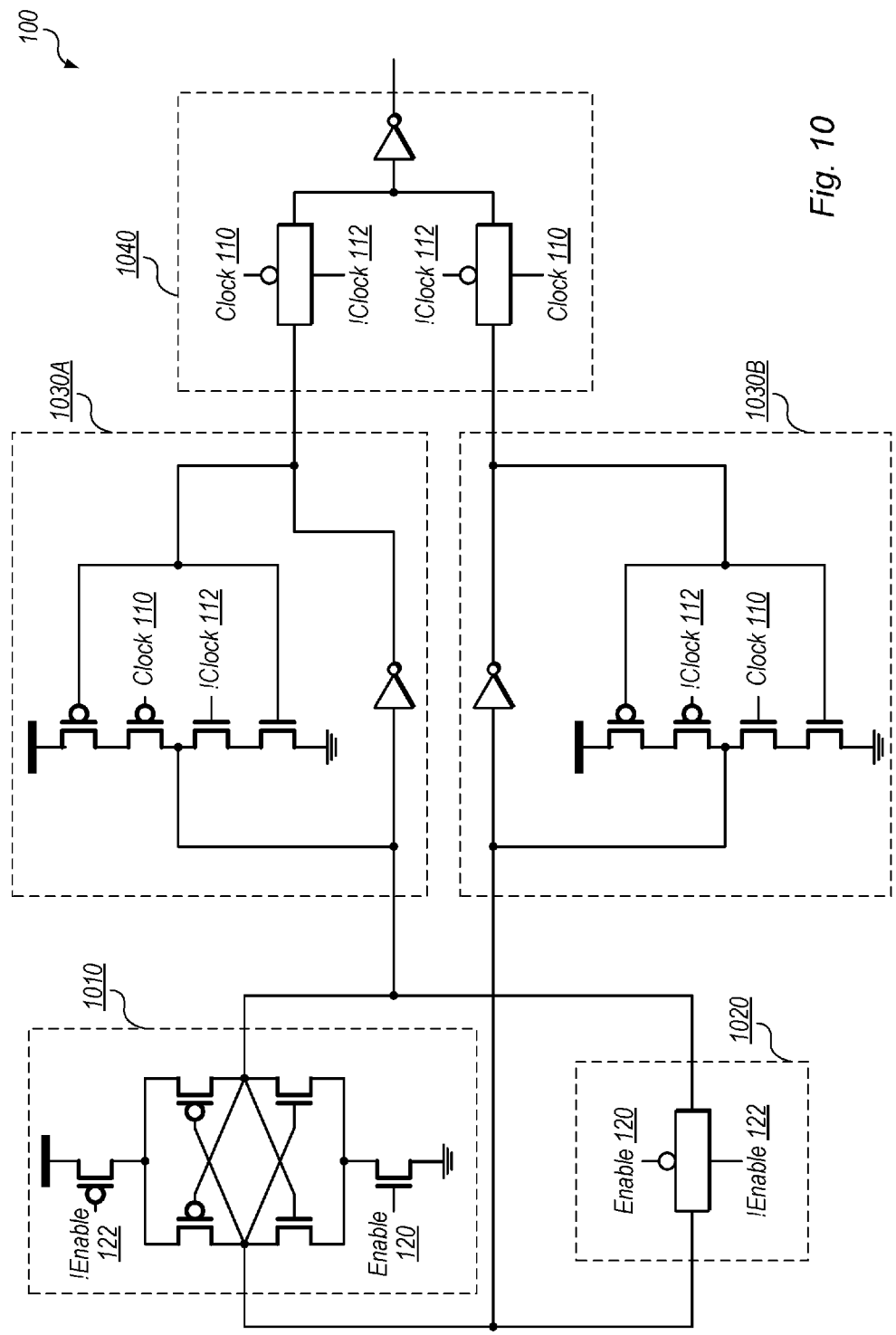
FIG. 10 is a transistor-level diagram illustrating an exemplary implementation of the DET clock gater of FIG. 4, according to some embodiments.

FIG. 10, discussed in further detail below, provides additional details regarding exemplary circuit implementations of the various elements of FIG. 4.

Exemplary Techniques for Balancing Delay

In some implementations, the difference in delay between inverting and non-inverting modes of a clock gater may introduce delay imbalances in the clock tree. FIG. 6 is a block diagram illustrating two sets of clock gaters arranged in series. In the illustrated embodiment, the first series includes clock gaters 640A-640N and the second series includes clock gaters 650A-N. Both series are configured to receive the same input clock 610 and are configured to route the clock (when none of the gaters are gating the clock) to DET sequential circuitry 620A and 620B respectively.

In the illustrated embodiment, DET sequential circuitry 620A is configured to generate one or more signals for combinational circuitry 630, which is then configured to generate one or more output signals that are stored in DET sequential circuitry 620B on a next clock edge.

If one of more of the clock gaters in a given series is gating the clock, then the clock signal will not be provided to the corresponding sequential circuitry at the end of the series. This may be desirable to reduce power consumption when the sequential circuitry is not being used. The hierarchical arrangement of clock gaters may allow for granularity in the areas of an integrated circuit that are clock gated at a given time. Each clock gater may or may not provide its output clock to additional sequential circuitry (not shown) as well as to the next clock gater. Depending on workload, different clock gaters in a given series may be clocked for different numbers of cycles. Therefore, referring back to FIGS. 2A and 2B, some of the clock gaters in a series may be in a polarity inverting mode while others may not.

Balancing the delay between the two series may be desirable, e.g., to prevent early or late launch of data from circuitry 620A and early or late capture of data by circuitry 620B. In some implementations, differences in clock delay between the two series may be compensated for by using padding circuitry, but such padding may consume area and power. Further, the difference in delay may change dynamically based on a change in the number of clock gaters in inverting mode.

For example, in CMOS technology, the delay in providing a signal and the inverse of the signal may be inherently unbalanced. Thus, a clock gater in polarity inverting mode may impose a different delay than a clock gater in a non-inverting mode. Depending on the length of time that each clock gater is gating the clock, the number of clock gaters in a given series that are in inverting mode changes over time, in various embodiments. In some implementations, transistors may be added to clock gater cells in an attempt to reduce the difference in delay between inverting and non-inverting modes, but a perfect balance may never be achieved and may not address the dynamic nature of the difference in delay in a chain of clock gaters. Therefore, in some embodiments, a controlled delay circuit is used between clock gaters and sequential circuitry to balance clock delay.

FIG. 7 is a block diagram of a device that includes controlled delay elements for the first and second series of clock gaters of FIG. 6. In the illustrated embodiment, clock gaters 640 provide respective mode indication signals 752A-752N to controlled delay circuit 720A and clock gaters 650 provide respective mode indication signals 754A-754N to controlled delay circuit 720B. In the illustrated embodiment, controlled delay circuits 720 are configured to add a configurable delay to the clock lines based on the number of clock gaters that are in inverting mode or non-inverting mode in a given series of clock gaters. In some embodiments, this substantially reduces differences in delay between the different series, which may allow sequential circuitry 620 to meet timing requirements without padding, for example.

FIG. 8 is a block diagram illustrating one embodiment of control circuitry configured to determine how to adjust the delay of a controlled delay circuit 720A. In the illustrated embodiment, the control circuitry includes AND gates 860 and 870. In the illustrated embodiment, the controlled delay circuit is configured to adjust for only the two most substantial potentially hazardous situations where either all of clock gaters 640A-640C are in inverting mode (as detected by AND gate 860) or all of the clock gaters are in non-inverting mode (as detected by AND gate 870). In other embodiments, controlled delay circuit 720A may be controlled at any of various granularities, including based on information indicating the exact number of clock gaters in inverting mode and non-inverting mode in an input series of clock gaters. Speaking generally, controlled delay circuitry may be configured to cause a number of different lengths of delays and may select an appropriate delay based on a number of clock gaters in a particular mode exceeding a pre-determined threshold value.

In the illustrated embodiment, controlled delay circuit 720A is configured to cause a nominal delay between its input and its output when neither of increase delay signal 850 and reduce delay signal 865 are asserted. In the illustrated embodiment, if increase delay signal 850 is asserted, the controlled delay circuit 720A is configured to impose a delay between its input and output that is longer than the nominal delay. If reduce delay signal 865 is asserted, controlled delay circuit 720A is configured to impose a delay between its input and output that is shorter in duration that the nominal delay. Referring back to FIG. 7, if both controlled delay circuits 720A and 720B are configured to adjust their delay in the worst-case scenarios handled in FIG. 8, then the maximum delay difference between the two series of clock gaters that is caused by the asymmetry of inverting and non-inverting modes may be substantially reduced.

To determine whether a given clock gater 100 is in inverting or non-inverting mode, control circuitry may simply read one of the outputs of storage element 410, in the embodiment of FIG. 4. This value will have one value for inverting mode and another value for non-inverting modes. In other embodiments (e.g., the embodiment of FIG. 3B), control circuitry may use the outputs of one of the latches to determine the mode. In some embodiments, mode detection for a given clock gater may be implemented using a dual-edge flop that receives the input clock to the clock gater as its clock and the XOR of the input clock to the clock gater and the output clock from the clock gater as its input. This may allow for mode detection when standard cells are used for clock gaters (these cells may be a "black box" such that they cannot be easily modified).

In various embodiments, hierarchies of clock gaters on the clock tree may have any of various appropriate number of branches, numbers of clock gaters in each series leading to a controlled delay circuit 720, numbers of controlled delay circuits 720, etc. The exemplary embodiments are shown for purposes of illustration but are not intended to limit the scope of the present disclosure.

Figure 9A:
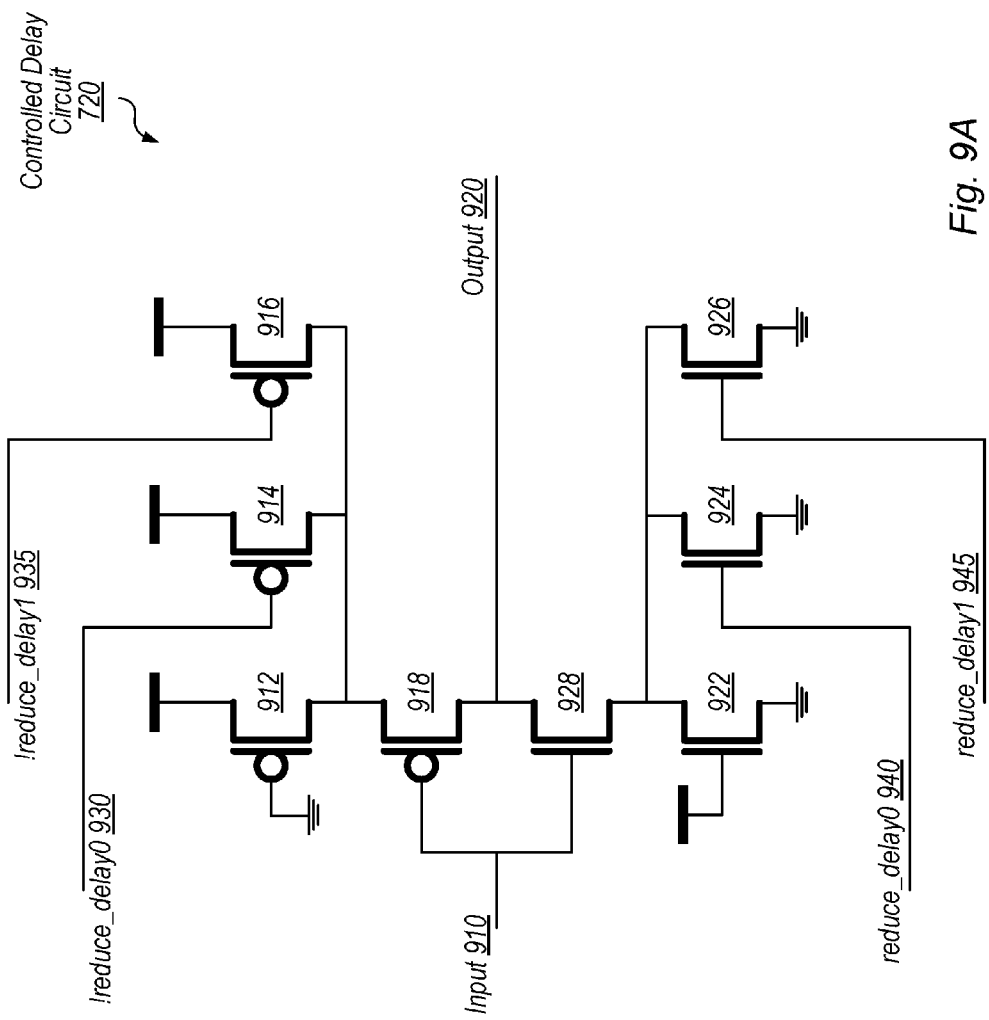
FIGS. 9A-9B are transistor-level diagrams illustrating exemplary controlled delay circuitry, according to some embodiments.

FIG. 9A is a circuit diagram illustrating an exemplary controlled delay circuit 720, according to some embodiments. In the illustrated embodiment, controlled delay circuit 720 is a complementary metal oxide semiconductor (CMOS) circuit that includes eight transistors 912, 914, 916, 918, 922, 924, 926, and 928. In the illustrated embodiment, transistors 918 and 928 implement an inverter whose delay changes based on the number of transistors 914, 916, 924, and 926 that are active (the number of active transistors affects the current available to the inverter). The inverter implemented by transistors 918 and 920 may be referred to as a "starved inverter."

In the illustrated embodiment, control circuitry (not shown) is configured to generate a two-bit signal reduce_delay. In the illustrated embodiment, if both bits of reduce_delay are set, then controlled delay circuit 720 causes the least amount of delay that it is configured to achieve. If neither of the bits are set then controlled delay circuit 720 causes the nominal delay. If one of the bits is set then controlled delay circuit 720 causes an intermediate reduction in delay. In the illustrated embodiment, when the first bit of reduce_delay is asserted, transistors 914 and 924 are active and when the other bit of reduce_delay is asserted, transistors 916 and 926 are active.

The change in delay, in the illustrated embodiment, is achieved using a starved inverter (implemented using transistors 918 and 928) that receives less current than a traditional inverter because of the resistance of transistors 912 and 922. In the illustrated embodiment, enabling inverters 914/924 and/or 916/926 adjusts the amount of current provided to the starved inverter and thus changes the delay that it imposes on input signal 910.

Note that, in the illustrated embodiment, controlled delay circuit 720 is configured to reduce delay but not increase delay. In other embodiments, controlled delay circuitry 720 is configured to increase delay from a nominal delay but not reduce delay. In other embodiments, controlled delay circuitry 720 is configured to both reduce delay relative to a nominal delay and increase delay relative to the nominal delay, depending on control input signals.

The embodiment of FIG. 9A is shown for illustrative purposes and is not intended to limit the scope of the present disclosure. In other embodiments, any of various circuitry may be used to implement controlled delay circuit 720. In the illustrated embodiment of FIG. 9A, if there is a series of two clock gaters providing signals to controlled delay circuit 720, then controlled delay circuit 720 can implement a different delay for each different scenario involving the modes of the clock gaters in this series (both gaters inverting, neither inverting, or one inverting and one not inverting). If a greater number of clock gaters in series are providing input signal 910, then control circuitry may be configured to control controlled delay circuit 720 in different modes depending on whether a threshold number of clock gaters in the series are inverting or non-inverting. As one non-limiting example, if more than a third of the clock gaters are in a slower mode, transistors 914 and 924 may be activated and if more than two thirds of the clock gaters are in a slower mode, all four transistors 914, 924, 916, and 926 may be activated. Similarly, delay control signals may be asserted based on different threshold numbers of clock gaters being in a faster mode, in embodiments in which controlled delay circuit 720 is configured to increase delay relative to a nominal delay.

Figure 9B:
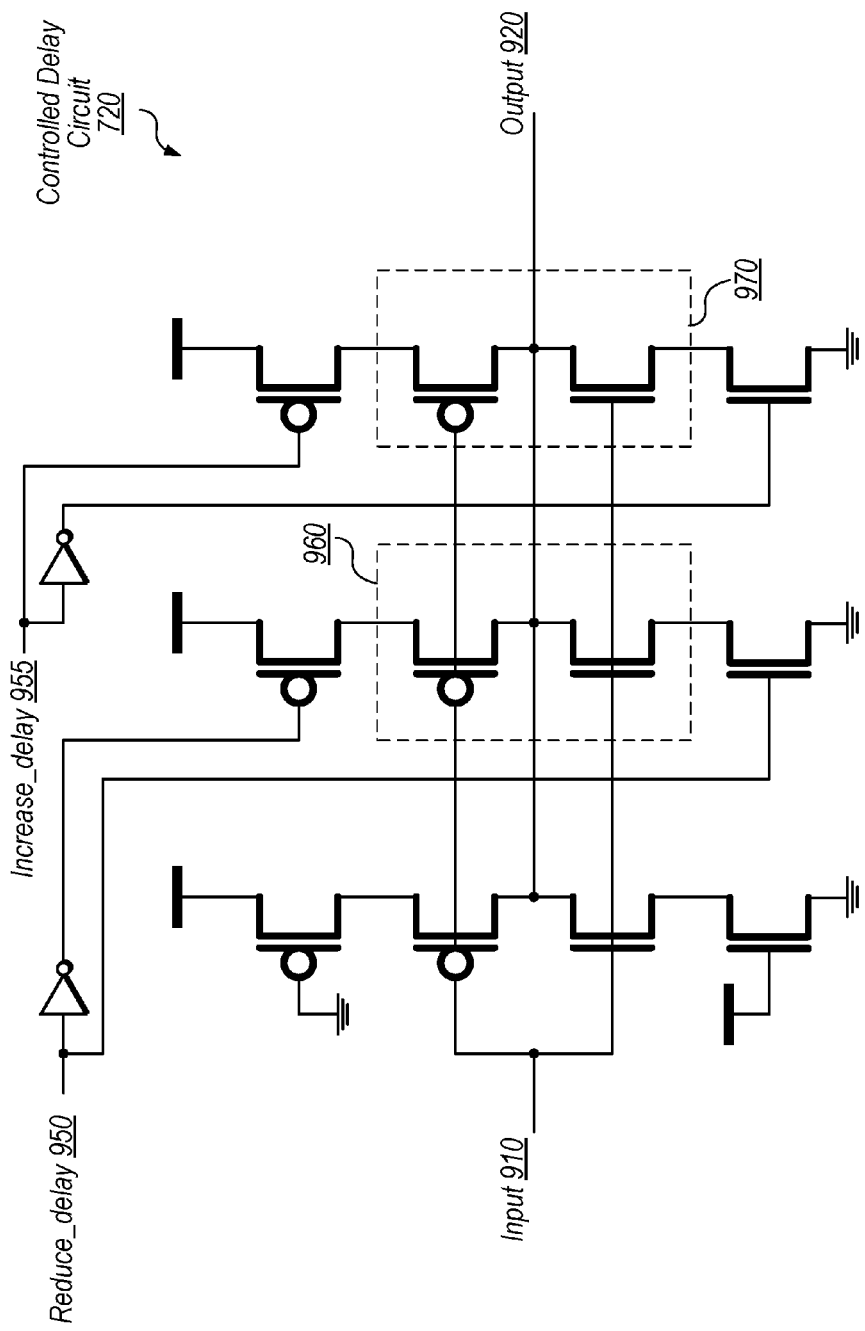

As another example, FIG. 9B shows an exemplary implementation of controlled delay circuit 720 that is configured to both reduce and increase delay imposed on an input signal 910, where the reductions and increases are performed at different times based on control signaling. Control circuitry may generate input signals increase_delay 955 and reduce_delay 950 based on the number of DET clock gaters in a series that are in a particular mode (e.g., inverting or non-inverting), where the series provides input signal 910.

In the illustrated embodiment, a nominal delay is asserted if both increase_delay signal 955 and reduce_delay signal 950 are not asserted. In this situation, inverter 970 is enabled and inverter 960 is disabled.

In the illustrated embodiment, if increase_delay 955 is asserted and reduce_delay 940 is not, then both inverters 960 and 970 are inactive, resulting in the greatest delay that this embodiment of circuit 720 is configured to impose. In the illustrated embodiment, if reduce_delay 950 is asserted and increase_delay 955 is not, then both inverters 960 and 970 are active, resulting in the smallest delay that this embodiment of circuit 720 is configured to impose.

As discussed above with reference to FIG. 9A, FIG. 9B is illustrative and is not intended to limit the scope of the present disclosure. Controlled delay circuit 720 may be implemented using any of various appropriate circuit implementations in other embodiments. The illustrated circuitry of FIG. 9A or 9B and their corresponding structural equivalents may be referred to as means for adjusting delay imposed on an output signal from a series of DET clock gater circuits.

Exemplary Clock Gater Implementation

FIG. 10 shows an exemplary circuit implementation of a clock gater 100, according to some embodiments. In the illustrated embodiment, clock gater 100 includes storage element 1010, buffering circuitry 1020, latches 1030A and 1030B, and clock-controlled multiplexer 1040. In some embodiments, the illustrated circuitry can be implemented using twenty-six transistors.

Storage element 1010, in the illustrated embodiment, is implemented using cross-coupled inverters. In the illustrated embodiment, when enable is not asserted, the inverters are disconnected from the power supply and the outputs of storage element 1010 are tri-stated. In other embodiments, storage element 1010 is implemented using any of various appropriate circuitry. The illustrated cross-coupled inverters and their corresponding structural equivalents may be referred to as means for storing an indication of which of first and second storage elements stores a first digital value and which of the first and second storage elements stores a second, different digital value.

Buffering circuitry 1020, in the illustrated embodiment, is implemented as a transmission gate controlled by enable 120 and its inverse !enable 122. In some embodiments, the transmission gate is implemented using two tri-statable inverters. In various embodiments, the transmission gate is configured to connect the inputs of the two latches 1030 when enable is de-asserted and configured to tri-state the connection when enable is asserted (allowing the storage element to drive the latches). The illustrated transmission gate and its corresponding structural equivalents may be referred to as means for copying data stored in one of first and second storage elements to the other of the first and second storage elements.

Latches 1030, in the illustrated embodiment, are implemented with bi-directional data input such that the output of a given latch 1030 can drive the input of the other latch 1030 via buffering circuitry 1020. In other embodiments, latches 1030 may be implemented using other bi-directional configurations. In still other embodiments, buffering circuitry 1020 may couple the output of the latches to the input of the other latch, e.g., in non-bi-directional embodiments. The illustrated latch storage elements and their corresponding structural equivalents may be referred to as means for storing a first digital value and a second digital value in first and second storage elements.

Clock-controlled multiplexer 1040, in the illustrated embodiment, is implemented using two transmission gates and an inverter. In some embodiments, multiplexer 1040 is configured to output the state of either latch 1030A or 1030B depending on the state of clock 110. The illustrated transmission gates and inverter and their corresponding structural equivalents may be referred to as means for selecting between outputs of first and second storage elements to generate an output signal.

FIG. 10 is included in the present disclosure to explain one exemplary implementation of clock gater 100, but it is not intended to limit the scope of the present disclosure. As is well known to those in the art, there may be many different circuit implementations that perform equivalent functions to the circuitry of FIG. 10.

Exemplary Methods

FIG. 11 is a flow diagram illustrating one exemplary embodiment of a method 1100 for operating a dual-edge triggered clock gater. The method shown in FIG. 11 may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired. Flow begins at 1110.

In the illustrated embodiment, method 1100 is a method for generating an output signal based on an input clock signal and a control signal that indicates whether to gate the input clock signal. Enable signal 120 is an example of such a control signal. A gate signal is another example of such a control signal and may correspond to the inverse of enable signal 120.

At 1110, in the illustrated embodiment, a first storage element (e.g., latch 430A) stores a first digital value and a second storage element (e.g., latch 430B) stores the inverse of the first digital value. In some embodiments, this occurs while the control signal indicates that the input clock signal is not being gated.

At 1120, in the illustrated embodiment, the circuit selects, based on the input clock signal, between outputs of the first and second storage elements to generate the output signal.

At 1130, in the illustrated embodiment, a third storage element (e.g., storage element 410) stores an indication of which of the first and second storage elements stores the first digital value. In the illustrated embodiment, the third storage element also provides inputs to the first and second storage elements when the device is not gating the input clock signal.

In some embodiments, a buffering element (e.g., buffering circuitry 420) copies, when the device is gating the input clock signal, data stored in one of the first and second storage elements to the other of the first and second storage elements. In some embodiments, this results in the storage elements holding the same value until the control signal indicates to stop gating the clock signal.

FIG. 12 is a flow diagram illustrating one exemplary embodiment of a method 1200 for controlling the delay associated with a series of DET clock gaters. The method shown in FIG. 12 may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired. Flow begins at 1210.

At 1210, in the illustrated embodiment, a device provides a clock signal to sequential circuitry via a first series of DET clock gater circuits. The first series may correspond to gaters 640A-640N of FIG. 7, for example. The sequential circuitry may be configured to perform any of various actions using the clock signal, such as storing received data in flip-flops for example.

At 1220, in the illustrated embodiment, the device determines respective modes of the DET clock gater circuits, where the mode indicates whether or not a particular DET clock gater is inverting the polarity of its input clock when generating an output clock signal. FIG. 2A, discussed in detail above, shows one example of signals during a non-inverting mode while the right-hand portion of FIG. 2B shows an example of signals during an inverting mode. In some embodiments, the mode of a given DET clock gater at a given point in time is based on whether its control signal has indicated to clock gate for an even or an odd number of edges in the past.

At 1230, in the illustrated embodiment, the device adjusts delay asserted by an adjustable delay circuit that is coupled to delay the clock signal output from the first series of DET clock gater circuits. The adjustable delay circuit may be implemented according to the embodiment of FIG. 9A, the embodiment of FIG. 9B, or any of various other appropriate implementations. In some embodiments, control circuitry is configured to control the adjustable delay circuit based on whether a threshold number of the DET clock gaters is in a particular mode.

In some embodiments, similar techniques are used with a second series of DET clock gaters. In these embodiments, the techniques may match the delays of the two series of DET clock gaters (where "matching" includes achieving delays that are not exactly the same, but are within some acceptable threshold difference of each other). In various embodiments, this may increase timing margins which may in turn improve performance and/or reduce the power consumption of a circuit design.

Exemplary Device

Referring now to FIG. 13, a block diagram illustrating an exemplary embodiment of a device 1300 is shown. In some embodiments, elements of device 1300 may be included within a system on a chip. In some embodiments, device 1300 may be included in a mobile device, which may be battery-powered. Therefore, power consumption by device 1300 may be an important design consideration. In the illustrated embodiment, device 1300 includes fabric 1310, compute complex 1320 input/output (I/O) bridge 1350, cache/memory controller 1345, graphics unit 1380, and display unit 1365. In some embodiments, device 1300 may include other components (not shown) in addition to and/or in place of the illustrated components, such as video processor encoders and decoders, image processing or recognition elements, computer vision elements, etc.

Fabric 1310 may include various interconnects, buses, MUX's, controllers, etc., and may be configured to facilitate communication between various elements of device 1300. In some embodiments, portions of fabric 1310 may be configured to implement various different communication protocols. In other embodiments, fabric 1310 may implement a single communication protocol and elements coupled to fabric 1310 may convert from the single communication protocol to other communication protocols internally.

In the illustrated embodiment, compute complex 1320 includes bus interface unit (BIU) 1325, cache 1330, and cores 1335 and 1340. In various embodiments, compute complex 1320 may include various numbers of processors, processor cores and/or caches. For example, compute complex 1320 may include 1, 2, or 4 processor cores, or any other suitable number. In one embodiment, cache 1330 is a set associative L2 cache. In some embodiments, cores 1335 and/or 1340 may include internal instruction and/or data caches. In some embodiments, a coherency unit (not shown) in fabric 1310, cache 1330, or elsewhere in device 1300 may be configured to maintain coherency between various caches of device 1300. BIU 1325 may be configured to manage communication between compute complex 1320 and other elements of device 1300. Processor cores such as cores 1335 and 1340 may be configured to execute instructions of a particular instruction set architecture (ISA) which may include operating system instructions and user application instructions.

Cache/memory controller 1345 may be configured to manage transfer of data between fabric 1310 and one or more caches and/or memories. For example, cache/memory controller 1345 may be coupled to an L3 cache, which may in turn be coupled to a system memory. In other embodiments, cache/memory controller 1345 may be directly coupled to a memory. In some embodiments, cache/memory controller 1345 may include one or more internal caches.

As used herein, the term "coupled to" may indicate one or more connections between elements, and a coupling may include intervening elements. For example, in FIG. 13, graphics unit 1380 may be described as "coupled to" a memory through fabric 1310 and cache/memory controller 1345. In contrast, in the illustrated embodiment of FIG. 13, graphics unit 1380 is "directly coupled" to fabric 1310 because there are no intervening elements.

Graphics unit 1380 may include one or more processors and/or one or more graphics processing units (GPU's). Graphics unit 1380 may receive graphics-oriented instructions, such as OPENGL®, Metal, or DIRECT3D® instructions, for example. Graphics unit 1380 may execute specialized GPU instructions or perform other operations based on the received graphics-oriented instructions. Graphics unit 1380 may generally be configured to process large blocks of data in parallel and may build images in a frame buffer for output to a display. Graphics unit 1380 may include transform, lighting, triangle, and/or rendering engines in one or more graphics processing pipelines. Graphics unit 1380 may output pixel information for display images. In the some embodiments, graphics unit 1380 includes a programmable shader core.

Display unit 1365 may be configured to read data from a frame buffer and provide a stream of pixel values for display. Display unit 1365 may be configured as a display pipeline in some embodiments. Additionally, display unit 1365 may be configured to blend multiple frames to produce an output frame. Further, display unit 1365 may include one or more interfaces (e.g., MIPI® or embedded display port (eDP)) for coupling to a user display (e.g., a touchscreen or an external display).

I/O bridge 1350 may include various elements configured to implement: universal serial bus (USB) communications, security, audio, and/or low-power always-on functionality, for example. I/O bridge 1350 may also include interfaces such as pulse-width modulation (PWM), general-purpose input/output (GPIO), serial peripheral interface (SPI), and/or inter-integrated circuit (I2C), for example. Various types of peripherals and devices may be coupled to device 1300 via I/O bridge 1350.

In some embodiments, various elements of device 1300 may include clock gaters arranged hierarchically, including various series of DET clock gaters coupled to deliver clock signals to different portions of a clock tree. The disclosed techniques may reduce switching power consumption in device 1300, balance the clock delay to different portions of device 1300, reduce errors in device 1300, achieve higher frequency, achieve required frequency at a lower power supply voltage, reduce energy dissipated per cycle (or per task, per pixel, or per byte, for example), etc.

Exemplary Computer-Readable Medium

The present disclosure has described various exemplary circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

FIG. 14 is a block diagram illustrating an exemplary non-transitory computer-readable storage medium that stores circuit design information, according to some embodiments. In the illustrated embodiment semiconductor fabrication system 1420 is configured to process the design information 1415 stored on non-transitory computer-readable medium 1410 and fabricate integrated circuit 1430 based on the design information 1415.

Non-transitory computer-readable medium 1410, may comprise any of various appropriate types of memory devices or storage devices. Medium 1410 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Medium 1410 may include other types of non-transitory memory as well or combinations thereof. Medium 1410 may include two or more memory mediums which may reside in different locations, e.g., in different computer systems that are connected over a network.

Design information 1415 may be specified using any of various appropriate computer languages, including hardware description languages such as, without limitation: VHDL, Verilog, SystemC, SystemVerilog, RHDL, M, MyHDL, etc. Design information 1415 may be usable by semiconductor fabrication system 1420 to fabrication at least a portion of integrated circuit 1430. The format of design information 1415 may be recognized by at least one semiconductor fabrication system 1420. In some embodiments, design information 1415 may also include one or more cell libraries which specify the synthesis and/or layout of integrated circuit 1430. In some embodiments, the design information is specified in whole or in part in the form of a netlist that specifies cell library elements and their connectivity.

Semiconductor fabrication system 1420 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1420 may also be configured to perform various testing of fabricated circuits for correct operation.

In various embodiments, integrated circuit 1430 is configured to operate according to a circuit design specified by design information 1415, which may include performing any of the functionality described herein. For example, integrated circuit 1430 may include any of various elements shown in FIGS. 4, 6, 7, 8, 9, and/or 10. Further, integrated circuit 1430 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
  dual-edge triggered clock gater circuitry configured to
    generate an output signal based on an input clock signal and a control signal that indicates whether to gate the input clock signal, including:
  first and second storage elements, wherein the first storage element is controlled by the input clock signal and the second storage element is controlled by an inversion of the input clock signal and wherein, based on a first state of the control signal, one of the first and second storage elements is configured to store a first digital value and the other of the first and second storage elements is configured to store a second digital value that is the inverse of the first digital value;
  multiplexer circuitry that is controlled by the input clock signal and is configured to select between outputs of the first and second storage elements to generate the output signal; and
  a third storage element configured to store an indication of which of the first and second storage elements stores the first digital value, and provide the first digital value and the inverse of the first digital value to the first and second storage elements based on the first state of the control signal.

2. The apparatus of claim 1, further comprising:
a buffering element configured to, in response to a second state of the control signal, copy data stored in one of the first and second storage elements to the other of the first and second storage elements.

3. The apparatus of claim 2, wherein the buffering element includes a transmission gate that is controlled based on the control signal.

4. The apparatus of claim 1, wherein the third storage element includes cross-coupled inverters.

5. The apparatus of claim 1, wherein the clock gater circuitry is configured to generate the output signal without using feedback from the output signal.

6. The apparatus of claim 1, wherein the first and second storage elements are bi-directional latches and wherein a buffering element is configured to connect an input of the first storage element to an input of the second storage element in response to a second state of the control signal.

7. The apparatus of claim 1, wherein the dual-edge triggered clock gater circuitry is configured to gate a next edge of the input clock signal in response to a second state of the control signal, regardless of whether the next edge is a rising edge or a falling edge.

8. A method, comprising:
  generating, by dual-edge trigger clock gater circuitry, an output signal based on an input clock signal and a control signal that indicates whether to gate the input clock signal;
  storing, when not gating the input clock signal, a first digital value in a first storage element and the inverse of the first digital value in a second storage element, wherein the first storage element is controlled by the input clock signal and the second storage element is controlled by an inversion of the input clock signal;
  selecting, by multiplexer circuitry based on the input clock signal, between outputs of the first and second storage elements to generate the output signal; and
  storing, by a third storage element, an indication of which of the first and second storage elements stores the first digital value, and providing the first digital value and the inverse of the first digital value to the first and second storage elements when not gating the clock signal.

9. The method of claim 8, further comprising:
  copying, by a buffering element in response to the control signal indicating to gate the input clock signal, data stored in one of the first and second storage elements to the other of the first and second storage elements.

10. The method of claim 9, wherein the first and second storage elements are bi-directional latches and wherein the copying includes the buffering element connecting an input of the first storage element to an input of the second storage element in response to the control signal indicating to gate the input clock signal.

11. The method of claim 9, wherein the copying, by the buffer element, is performed using a transmission gate that is controlled based on the control signal.

12. The method of claim 8, wherein the storing the indication, by the third storage element, is performed using cross-coupled inverters.

13. The method of claim 8, wherein the generating the output signal is performed without using feedback from the output signal.

14. A non-transitory computer readable storage medium having stored thereon design information that specifies a design of at least a portion of a hardware integrated circuit in a format recognized by a semiconductor fabrication system that is configured to use the design information to produce the circuit according to the design, including:
  dual-edge triggered clock gater circuitry configured to generate an output signal based on an input clock signal and a control signal that indicates whether to gate the input clock signal, including:
    first and second storage elements, wherein the first storage element is controlled by the input clock signal and the second storage element is controlled by an inversion of the input clock signal, wherein based on a first state of the control signal one of the first and second storage elements is configured to store a first digital value and the other of the first and second storage elements is configured to store a second digital value that is the inverse of the first digital value;
    multiplexer circuitry that is controlled by the input clock signal and is configured to select between outputs of the first and second storage elements to generate the output signal; and
    a third storage element configured to store an indication of which of the first and second storage elements stores the first digital value, and provide the first digital value and the inverse of the first digital value to the first and second storage elements based on the first state of the control signal.

15. The non-transitory computer readable storage medium of claim 14, wherein the dual-edge triggered clock gater circuitry further includes:
  a buffering element configured, in response to a second state of the control signal, to copy data stored in one of the first and second storage elements to the other of the first and second storage elements.

16. The non-transitory computer readable storage medium of claim 15, wherein the design information further specifies that the buffering element includes a transmission gate that is controlled based on the control signal.

17. The non-transitory computer readable storage medium of claim 14, wherein the design information further specifies that the third storage element includes cross-coupled inverters.

18. The non-transitory computer readable storage medium of claim 14, wherein the clock gater circuitry is configured to generate the output signal without using feedback from the output signal.

19. The non-transitory computer readable storage medium of claim 14, wherein the design information further specifies that the first and second storage elements are latches.

20. The non-transitory computer readable storage medium of claim 14, wherein the design information further specifies that the dual-edge triggered clock gater circuitry is configured to gate a next edge of the input clock signal in response to a second state of the control signal, regardless of whether the next edge is a rising edge or a falling edge.

\* \* \* \* \*